(12) United States Patent
Parker, II et al.

(10) Patent No.: US 10,869,370 B2
(45) Date of Patent: Dec. 15, 2020

(54) SCALABLE SELF-REGULATING CIRCUITS COMPRISING TRIMMABLE AND NON-TRIMMABLE SECTIONS

(71) Applicant: SIGNIFY HOLDING B.V., Eindhoven (NL)

(72) Inventors: Gregory Parker, II, Denver, CO (US); Raymond Janik, Fayetteville, GA (US); Timothy Bingaman, Thornton, CO (US)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/423,844

(22) Filed: May 28, 2019

(65) Prior Publication Data
US 2019/0364632 A1  Nov. 28, 2019

Related U.S. Application Data

(60) Provisional application No. 62/676,499, filed on May 25, 2018.

(51) Int. Cl.
*H05B 45/10* (2020.01)
*H05B 45/44* (2020.01)
(Continued)

(52) U.S. Cl.
CPC ............ *H05B 45/10* (2020.01); *F21K 9/278* (2016.08); *H03K 5/24* (2013.01); *H05B 45/44* (2020.01); *H05K 1/0292* (2013.01); *H05K 1/181* (2013.01); *F21V 23/06* (2013.01); *F21Y 2103/10* (2016.08); *F21Y 2115/10* (2016.08); *H05K 2201/10022* (2013.01); *H05K 2201/10106* (2013.01); *H05K 2201/10151* (2013.01)

(58) Field of Classification Search
CPC ......... H05B 45/44; H05B 45/10; F21K 9/278; H03K 5/24; H05K 1/0292; H05K 1/181; H05K 2201/10022; H05K 2201/10106; H05K 2201/10151; H05K 1/0293; F21Y 2103/10; F21Y 2115/10; F21S 4/24; F21S 4/20; F21S 4/22; F21V 23/06
See application file for complete search history.

(56) References Cited

U.S. PATENT DOCUMENTS

| 4,587,461 A | 12/1986 | Hanlet |
| 5,559,681 A * | 9/1996 | Duarte ............... F21V 21/08 362/231 |

(Continued)

*Primary Examiner* — Borna Alaeddini

(57) ABSTRACT

An electrical circuit can include a circuit board having a first portion and a second portion. The electrical circuit can also include at least one first light source disposed on the first portion. The electrical circuit can further include multiple second light sources disposed on a trimmable section of the second portion. The electrical circuit can also include at least one third light source disposed on a non-trimmable section of the second portion. The trimmable section can be trimmed to form a trimmed circuit board. The trimmed circuit board can have disposed thereon a remainder of the plurality of the second light sources. The at least one first light source, the remainder of the plurality of second light sources, and the at least one third light source can be disposed on the trimmed circuit board in such a way as to provide substantially uniform light.

18 Claims, 13 Drawing Sheets

(51) Int. Cl.
  *F21K 9/278* (2016.01)
  *H05K 1/18* (2006.01)
  *H05K 1/02* (2006.01)
  *H03K 5/24* (2006.01)
  *F21Y 103/10* (2016.01)
  *F21Y 115/10* (2016.01)
  *F21V 23/06* (2006.01)

(56) References Cited

U.S. PATENT DOCUMENTS

| | | | |
|---|---|---|---|
| 7,612,613 B2 | 11/2009 | Kang et al. | |
| 8,947,004 B2 * | 2/2015 | Chen | H05B 45/48 |
| | | | 315/193 |
| 9,320,098 B2 * | 4/2016 | Yoo | H05B 45/44 |
| 9,538,596 B2 * | 1/2017 | Radermacher | H05B 45/00 |
| 10,724,712 B2 * | 7/2020 | Li | F21S 4/28 |
| 2016/0014860 A1 | 1/2016 | Yoo | |
| 2019/0032870 A1 * | 1/2019 | Qiu | F21S 4/24 |

* cited by examiner

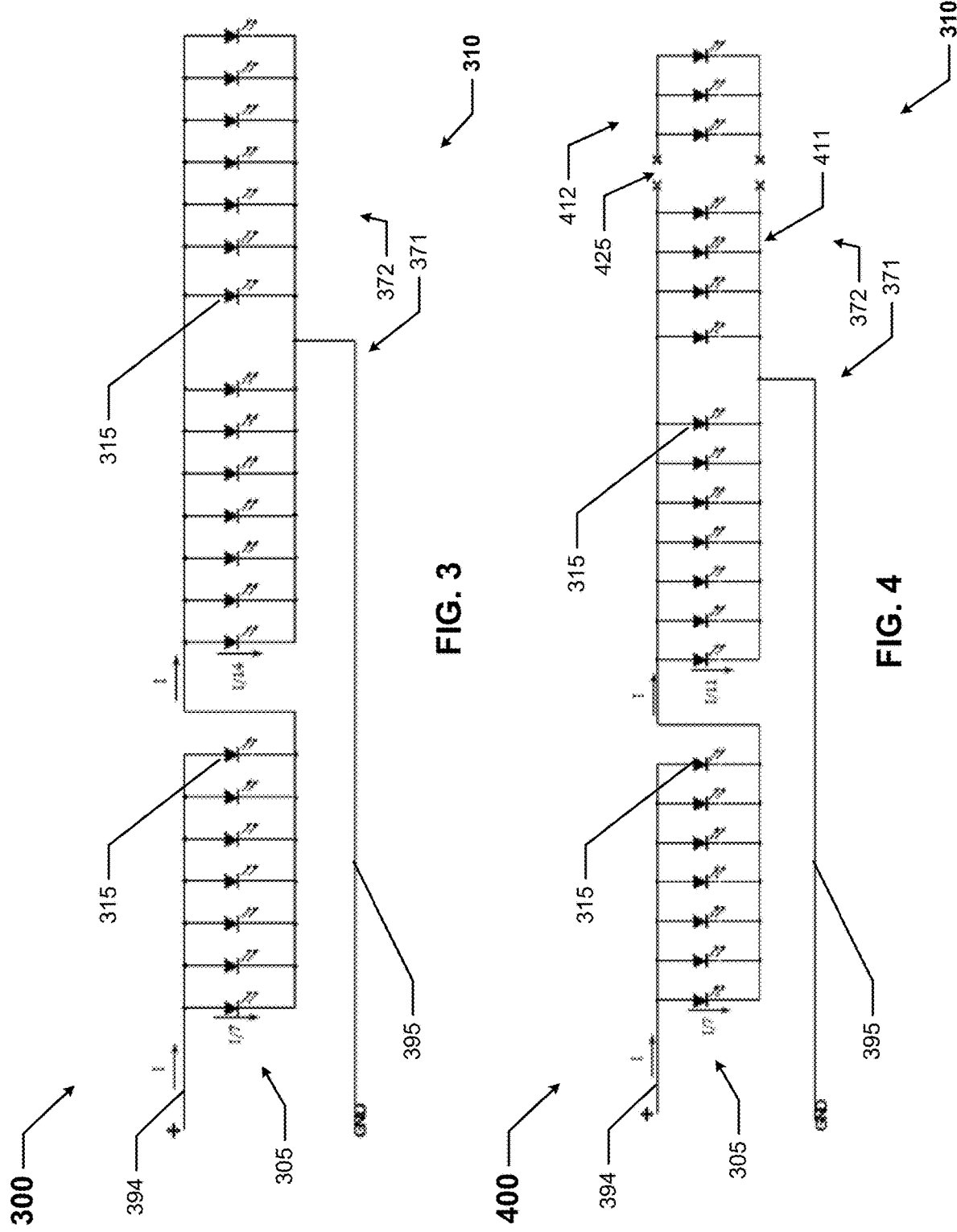

US 10,869,370 B2

SCALABLE SELF-REGULATING CIRCUITS COMPRISING TRIMMABLE AND NON-TRIMMABLE SECTIONS

CROSS-REFERENCE TO RELATED APPLICATIONS

This application claims priority under 35 U.S.C. § 119 to U.S. Provisional Patent Application Ser. No. 62/676,499, titled "Scalable Self-Regulating Circuits" and filed on May 25, 2018, the entire contents of which are hereby incorporated herein by reference.

TECHNICAL FIELD

Embodiments described herein relate generally to electrical circuits, and more particularly to systems, methods, and devices for scalable and self-regulating circuits.

BACKGROUND

With some electrical devices, a common circuit board can be used. In such instances, the dimensions (e.g., the length) of those electrical devices can vary, and so the length of the common circuit board may also need to vary. For example, some light fixtures (e.g., linear light fixtures) can vary in length, and the lighting boards used in these light fixtures can accordingly vary in length.

SUMMARY

In general, in one aspect, the disclosure relates to an electrical circuit that can include a circuit board having a first portion and a second portion, where the second portion includes a trimmable section and a non-trimmable section. The electrical circuit can also include at least one first light source disposed on the first portion. The electrical circuit can further include multiple second light sources disposed on the trimmable section of the second portion. The electrical circuit can also include at least one third light source disposed on the non-trimmable section of the second portion. The trimmable section can be trimmed to form a trimmed circuit board. The trimmed circuit board can have disposed thereon a remainder of the second light sources. The at least one first light source, the remainder of the second light sources, and the at least one third light source can be disposed on the trimmed circuit board in such a way as to provide substantially uniform light.

In another aspect, the disclosure can generally relate to a linear light fixture that can include an insert that includes a base wall having a first length. The linear light fixture can also include a lighting assembly removably disposed on the base wall of the insert. The lighting assembly can include a circuit board having a first portion and a second portion, where the second portion includes a trimmable section. The lighting assembly can also include at least one first light source disposed on the first portion. The lighting assembly can further include multiple second light sources disposed on the trimmable section of the second portion. The lighting assembly can also include at least one third light source disposed on the non-trimmable section of the second portion. The trimmable section can be trimmed to form a trimmed circuit board having a second length that is no greater than the first length. The trimmed circuit board can have disposed thereon a remainder of the second light sources. The at least one first light source, the remainder of the second light sources, and the at least one third light source can be disposed on the trimmed circuit board in such a way as to provide substantially uniform light.

In another aspect, the disclosure can generally relate to an electrical circuit that can include a circuit board having a first portion and a second portion, where the second portion includes a trimmable section. The electrical circuit can also include at least one first light source disposed on the first portion. The electrical circuit can further include multiple second light sources disposed on the trimmable section of the second portion. At least a portion of the trimmable section can be trimmed away to generate a trimmed second portion. A subset of the plurality of second light sources can be disposed on the trimmed second portion. The at least one first light source and the subset of the plurality of second light sources can be arranged on the first portion and the trimmed second portion of the circuit board in such a way as to provide substantially uniform light.

These and other aspects, objects, features, and embodiments will be apparent from the following description and the appended claims.

BRIEF DESCRIPTION OF THE DRAWINGS

The drawings illustrate only example embodiments of scalable self-regulating circuits and are therefore not to be considered limiting of its scope, as scalable self-regulating circuits may admit to other equally effective embodiments. The elements and features shown in the drawings are not necessarily to scale, emphasis instead being placed upon clearly illustrating the principles of the example embodiments. Additionally, certain dimensions or positions may be exaggerated to help visually convey such principles. In the drawings, reference numerals designate like or corresponding, but not necessarily identical, elements.

FIG. 3 shows a circuit diagram of an entire circuit in accordance with certain example embodiments.

FIG. 4 shows the circuit diagram of FIG. 3 separated into two pieces.

DETAILED DESCRIPTION OF EXAMPLE EMBODIMENTS

Figure 1:
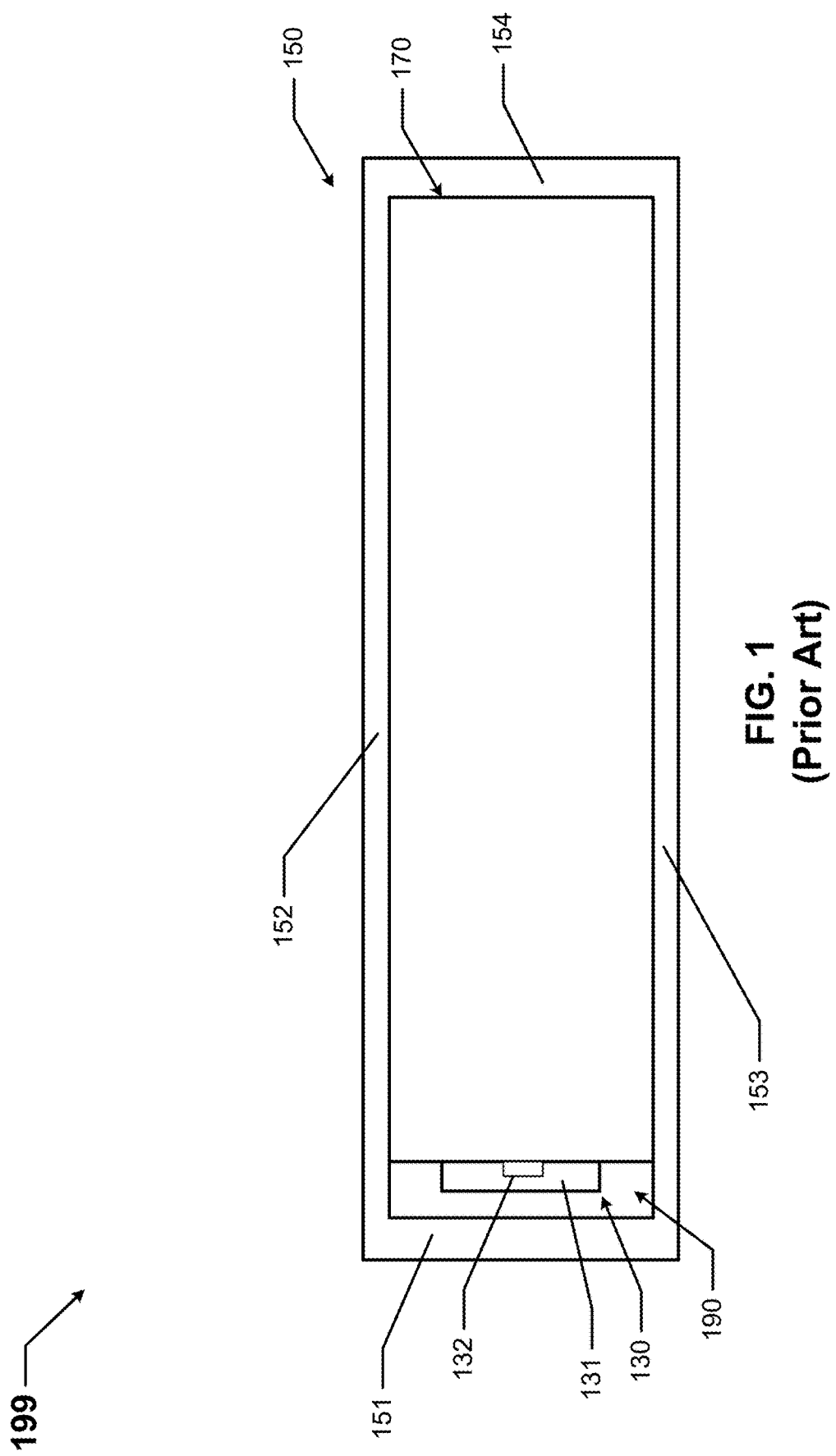
FIG. 1 shows a linear light fixture currently used in the art.

The example embodiments discussed herein are directed to systems, methods, and devices for scalable self-regulating circuits. While example embodiments are described herein as using example scalable self-regulating circuits in light fixtures, example embodiments can used in one or more of a number of other electrical devices in addition to, or as an alternative to, light fixtures. Such other electrical devices can include, but are not limited to, a light switch, a control panel, a wall outlet, a smoke detector, a $CO_2$ monitor, a motion detector, a broken glass sensor, and a camera.

Example embodiments can be located in any environment (e.g., indoor, outdoor, hazardous, non-hazardous, high humidity, low temperature, corrosive, sterile, high vibration). Light fixtures described herein can use one or more of a number of different types of light sources, including but not limited to light-emitting diode (LED) light sources, fluorescent light sources, organic LED light sources, incandescent light sources, and halogen light sources. Therefore, light fixtures described herein, even in hazardous locations, should not be considered limited to a particular type of light source. A light fixture described herein can be any of a number of different types of light fixtures, including but not limited to a linear light fixture, a pendant light fixture, a troffer light fixture, a floodlight, a spot light, a highbay light fixture, and a recessed light fixture.

A user may be any person that interacts with a light fixture and/or other electrical device in which example embodiments are used. Specifically, a user may install, remove, maintain, program, operate, and/or otherwise interface with one or more components (e.g., a controller, a network manager) associated with a system using example embodiments. Examples of a user may include, but are not limited to, an engineer, an electrician, an instrumentation and controls technician, a mechanic, an operator, a consultant, a contractor, a homeowner, a property manager, a landlord, a tenant, and a manufacturer's representative.

In certain example embodiments, electrical devices that have scalable self-regulating circuits are subject to meeting certain standards and/or requirements. For example, the National Electric Code (NEC), the National Electrical Manufacturers Association (NEMA), the International Electrotechnical Commission (IEC), Underwriters Laboratories (UL), the Federal Communication Commission (FCC), the Bluetooth Special Interest Group, and the Institute of Electrical and Electronics Engineers (IEEE) set standards that can be applied to electrical enclosures (e.g., light fixtures), wiring, location services, and electrical connections. Use of example embodiments described herein meet (and/or allow a corresponding device to meet) such standards when required. In some (e.g., PV solar) applications, additional standards particular to that application may be met by the electrical devices described herein.

If a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure. The numbering scheme for the various components in the figures herein is such that each component is a three-digit number or a four-digit number and corresponding components in other figures have the identical last two digits. For any figure shown and described herein, one or more of the components may be omitted, added, repeated, and/or substituted. Accordingly, embodiments shown in a particular figure should not be considered limited to the specific arrangements of components shown in such figure.

Further, a statement that a particular embodiment (e.g., as shown in a figure herein) does not have a particular feature or component does not mean, unless expressly stated, that such embodiment is not capable of having such feature or component. For example, for purposes of present or future claims herein, a feature or component that is described as not being included in an example embodiment shown in one or more particular drawings is capable of being included in one or more claims that correspond to such one or more particular drawings herein.

Example embodiments of scalable self-regulating circuits will be described more fully hereinafter with reference to the accompanying drawings, in which example embodiments of scalable self-regulating circuits are shown. Scalable self-regulating circuits may, however, be embodied in many different forms and should not be construed as limited to the example embodiments set forth herein. Rather, these example embodiments are provided so that this disclosure will be thorough and complete, and will fully convey the scope of scalable self-regulating circuits to those of ordinary skill in the art. Like, but not necessarily the same, elements (also sometimes called components) in the various figures are denoted by like reference numerals for consistency.

Terms such as "first", "second", "outer", "inner", "top", "bottom", "on", and "within" are used merely to distinguish one component (or part of a component or state of a component) from another. Such terms are not meant to denote a preference or a particular orientation, and such terms are not meant to limit embodiments of scalable self-regulating circuits. In the following detailed description of the example embodiments, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

FIG. 1 shows a linear light fixture 199 currently used in the art. The linear light fixture 199 of FIG. 1 includes a housing 150 and a lens 170 slidably disposed with respect to the housing 150. The housing has one or more walls (e.g., top wall 152, left side wall 151, right side wall 154, bottom wall 153), and one or more of these walls (in this case, top wall 152 and bottom wall 153) can include one or more coupling features (e.g., slots) used to slidably receive the lens 170. Such coupling features (hidden from view but shown and described in more detail below) can be positioned toward the distal end of the walls of the housing 150.

Disposed within the housing 150 can be one or more components of the linear light fixture 199. For example, visible in this case, are a light source 132 mounted on part of a circuit board 131 of a lighting assembly 130. In most cases, the circuit 131 is rigid. In some cases, in order to allow for removal of the lens 170 from the housing 150, which allows access to the lighting assembly 130 within the housing 150, the length of the lens 170 is shorter than the length of the housing 150 (in this case, the distance between the left side wall 151 and the right side wall 154 of the housing 150). As a result, there can be one or more (in this case, only one) gaps 190 between an end of the lens 170 and the housing 150.

Figure 2A:
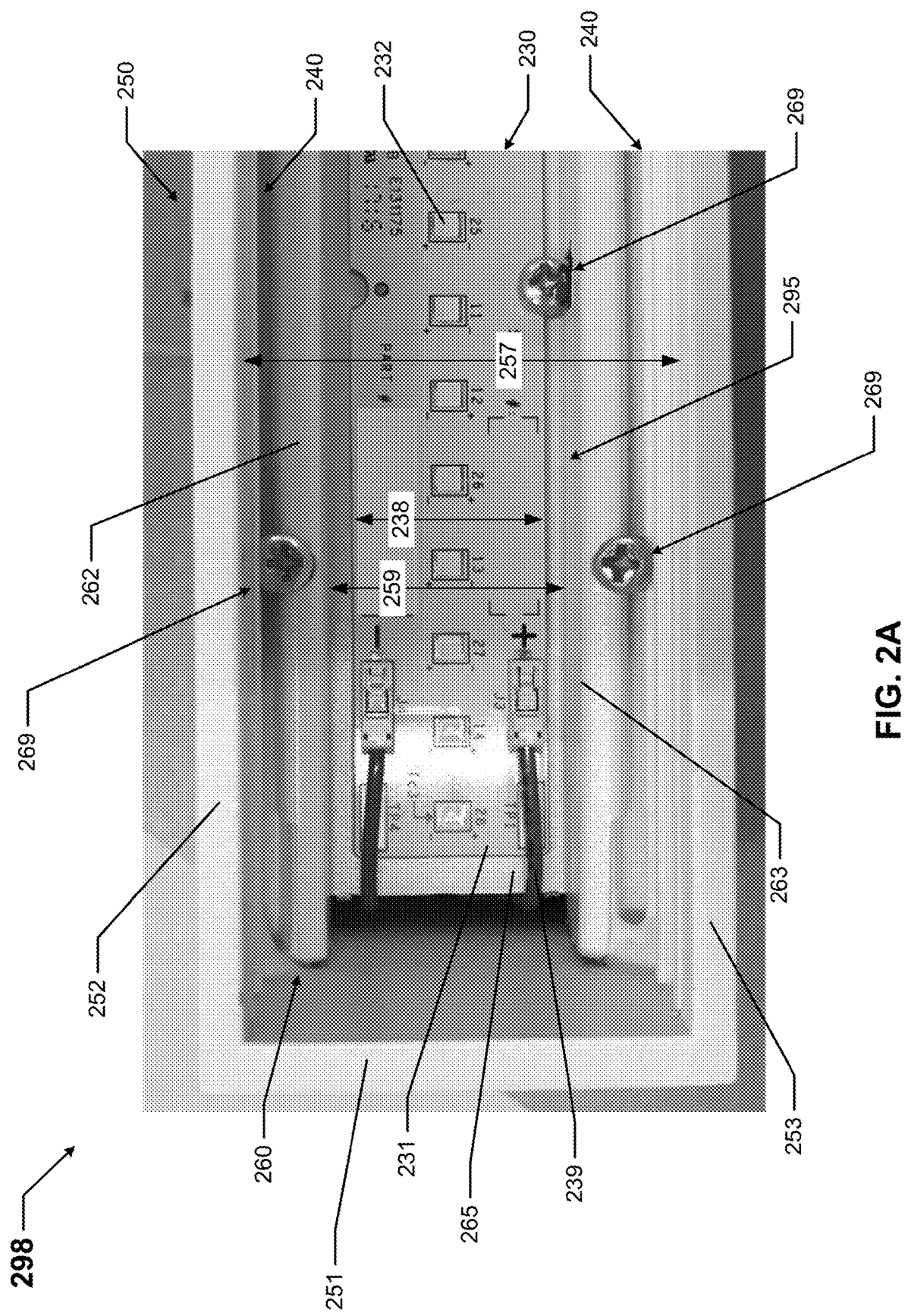
FIGS. 2A and 2B show a portion of a linear light fixture in accordance with certain example embodiments.
Figure 2B:
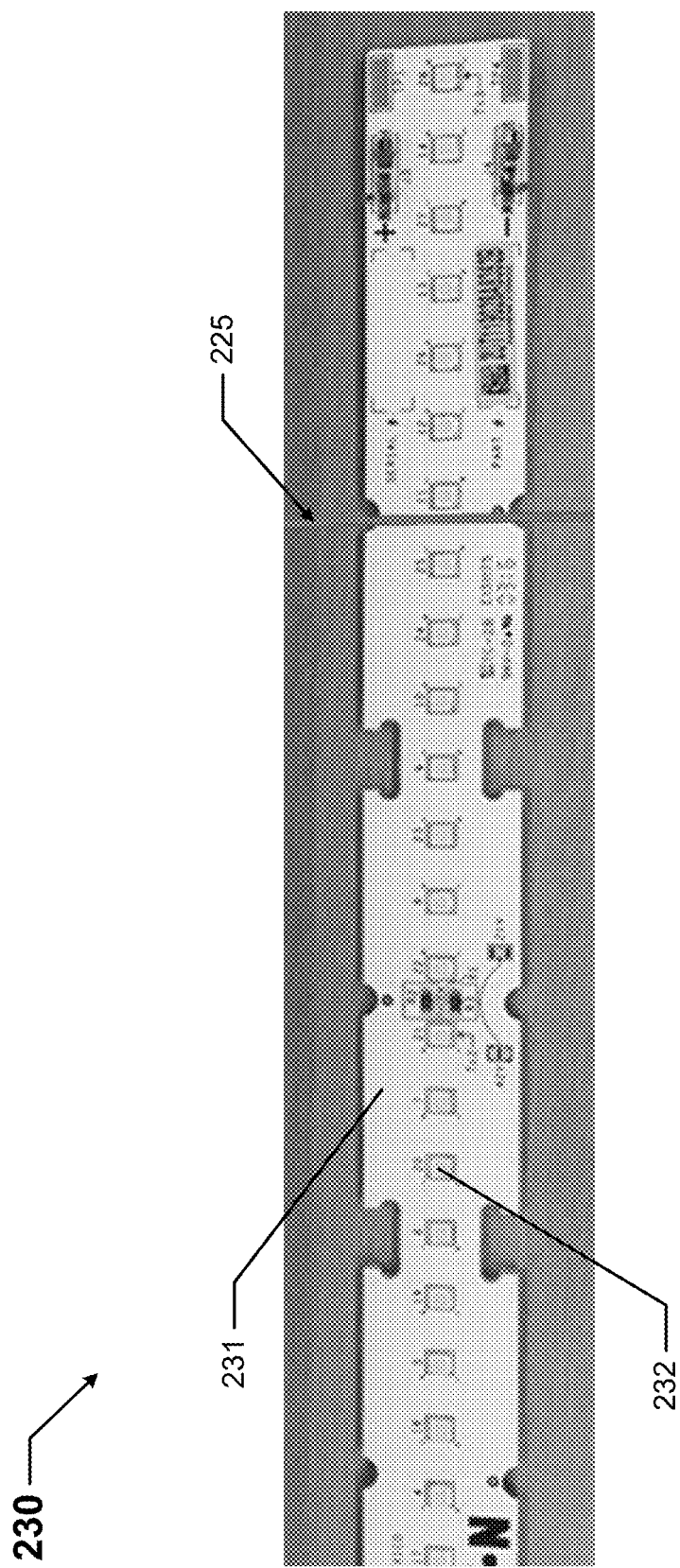

FIGS. 2A and 2B show a portion of a linear light fixture 298 in accordance with certain example embodiments. Specifically, FIG. 2A shows a top view of the portion of the linear light fixture 298, and FIG. 2B shows a top view of a trimmable lighting assembly 230 of the linear light fixture 298. Referring to FIGS. 1 through 2B, most of the features and components of the portion of the linear light fixture 298 of FIGS. 2A and 2B are substantially the same as the corresponding features and components of the linear light fixture of FIG. 1. For example, the housing 250 of the linear light fixture 298 of FIG. 2A has one or more walls (e.g., top wall 252, left side wall 251, bottom wall 253), and one or more of these walls (in this case, top wall 252 and bottom wall 253) can include one or more coupling features 240 (in this case, slots) used to slidably receive a lens (not shown in FIG. 2). The coupling features 240 in this case are positioned toward the distal end of the top wall 252 and the bottom wall 253 of the housing 250. The top wall 252 and the bottom wall 253 are separated from each other by distance 257.

Also shown in FIG. 2A, which is a common feature in linear light fixtures currently used in the art, is a removable insert 260. In some cases, the insert 260 can be considered a removable part of the housing 250. The insert 260 can be completely disposed within a cavity formed by the walls of the housing 250. In some cases, such as with housings 250 that are very long (e.g., several feet), there can be more than one removable insert 260 coupled to the housing 250. In such a case, the adjacent removeable inserts 260 can be disposed end-to-end.

The insert 260 can be secured to the housing 250 using one or more coupling features 269 (e.g., screws). The insert 260 can have one or more walls. For example, in this case, the insert 260 includes a base wall 265, a top wall 262 that extends from one side of the base wall 265, and a bottom wall 263 that extends from an opposite side of the base wall 265. In this case, the top wall 262 and the bottom wall 263 each form an angle that is substantially perpendicular with the base wall 265. In other cases, the top wall and the bottom wall of an insert can each extend at an obtuse angle from the base wall. The top wall 262 and the bottom wall 263 can be separated from each other by a distance 259, which in this case is also the width of the base wall 265 of the insert 260.

When an insert 260 is included with the housing 250, the lighting assembly 230 can be disposed thereon. For example, in this case, the circuit board 231 of the lighting assembly 230 is disposed on the base wall 265 of the insert 260. The circuit board 231 can be coupled to the base wall 265 using one or more coupling features 269 (e.g., screws). Disposed on the circuit board 231 in this case are a number of light sources 232 (in this case, LEDs). There are also two electrical conductors 239 connected to two electrical connector ends, which in turn are connected to the circuit board 231. The circuit board 231 has a width 238 that is less than the distance 259 between the top wall 262 and the bottom wall 263 of the insert 260.

In some cases, the circuit board 231 of the lighting assembly 230 can be used in a number of different linear light fixtures is trimmable, providing varying lengths. For example, the length of a linear light fixture 200 (and so also a length of the associated circuit board 231) can be customized to the nearest inch by separating the circuit board 231 into two pieces along a break line 225. As a result, some of the circuit boards 231 can be designed to be shortened to fit within a specific linear light fixture having a specific length. For example, there can be one or more sets of perforations along the circuit board 231 along which a circuit board 231 can be broken into multiple pieces. In such a case, the circuit board can have a substantially even distribution of light sources 232 and a redundancy of associated wiring so that one or more sections of a circuit board 231 that are separated from the rest of the circuit board 231 can function when attached to the housing 250 of the light fixture 298. The length of the circuit board 231 can be trimmed to match the length of one or more removeable inserts 260, the length of the housing 250, and/or some other length determined by a user.

A common problem with these adjustable length circuit boards 231 currently known in the art is that they lack uniform brightness, which is aesthetically unappealing. Also, in some cases, the regulation and control of a segment of a circuit board 231 in the current art is incomplete, which can lead to light sources 232 of a light fixture 298 controlled differently when they should all be controlled the same. These adjustable length circuit boards 231 currently known in the art can be electrically unbalanced, which in addition to causing optical issues that are less than optimal, can also cause overheating and other thermal issues that can cause failure of the circuit board 231 and/or other components of the linear light fixture 298.

Example embodiments described herein eliminate these problems with reduced performance of adjustable length circuit boards. Specifically, example embodiments provide uniform brightness of the light emitted by the light sources disposed on the circuit board, regardless of the length of the circuit board. Also, example embodiments provide for a balanced drive current flowing through all LEDs on the adjustable length circuit, which reduces the amount of stress imposed on the LEDs, thereby leading to longer useful life and higher reliability of the LEDs. Example embodiments also cost less money to produce than the less effective adjustable length circuit boards in the current art.

FIG. 3 shows a circuit diagram 300 of an entire circuit in accordance with certain example embodiments. Referring to FIGS. 1 through 3, the circuit of FIG. 3 uses a passive approach to self-regulation when part of the circuit has been trimmed. The circuit of FIG. 3 is untrimmed and has multiple portions, all of which can be disposed on a circuit board (e.g., circuit board 231). For example, in this case, the circuit shown in the circuit diagram 300 of FIG. 3 has a first portion 305 and a second portion 310. The first portion 305 is a fixed (non-trimmable) part of the circuit board and includes a known number (in this case, seven) of light sources 315 (e.g., LEDs) placed in parallel with each other. The electrical size of each of the light sources 315 of the first portion 305 can be substantially the same as each other, so that each light source 315 draws substantially the same current (in this case, ⅐ of the total current feeding the first portion 305 from voltage leg 394 and eventually flowing to ground 395).

The second portion 310 of the circuit of FIG. 3 has a non-trimmable section 371 and a trimmable section 372. Included in the non-trimmable section 371 of the second portion 310 of the circuit of FIG. 3 is one or more (in this case, seven) light sources 315 connected in parallel with each other. The type of light sources 315 of the non-trimmable section 371 of the second portion 310 can be substantially the same as, or different than, the type of light sources 315 of the first portion 305 of the circuit. In addition, or in the alternative, the number of light sources 315 of the non-trimmable section 371 of the second portion 310 can be substantially the same as, or different than, the number of light sources 315 of the first portion 305 of the circuit. Further, one light source 315 of the non-trimmable section 371 of the second portion 310 can be substantially the same as, or different than, one or more of the other light sources 315 of the non-trimmable section 371 of the second portion 310.

The trimmable section 372 of the second portion 310 of the circuit of FIG. 3 includes one or more (in this case seven) light sources 315 connected in parallel with each other. Further, the array of light sources 315 of the trimmable section 372 are connected in series with the array of light sources 315 of the non-trimmable section 371 of the second portion 310. The type of light sources 315 of the trimmable section 372 of the second portion 310 can be substantially the same as, or different than, the type of light sources 315 of the first portion 305 of the circuit and/or the type of light sources 315 of the non-trimmable section 371 of the second portion 310.

In addition, or in the alternative, the number of light sources 315 of the trimmable section 372 of the second portion 310 can be substantially the same as, or different than, the number of light sources 315 of the first portion 305 of the circuit and/or the number of light sources 315 of the non-trimmable section 371 of the second portion 310. Further, one light source 315 of the trimmable section 372 of the second portion 310 can be substantially the same as, or different than, one or more of the other light sources 315 of the trimmable section 372 of the second portion 310.

The light sources 315 of the non-trimmable section 371 can be scattered around various portions of the circuit board so that, when one or more light sources 315 of the trimmable section 372 are trimmed off, the overall brightness and diffusion of the light emitted by all of the light sources 315 that of the circuit diagram 300 that remain can be substantially uniform and the same as if all of the light sources of the trimmable section 372 were used. In alternative embodiments, the non-trimmable section 371 of the second portion 310 can be part of the first portion 305 so that the second portion 310 is only made up of the trimmable section 372. In yet other alternative embodiments, the second portion 310 can all be a trimmable section 372 with no non-trimmable section 371, while the first portion 305 can remain as shown in FIG. 3.

FIG. 4 shows a circuit diagram 400 of a circuit that includes the circuit of FIG. 3 separated into two pieces (trimmed) in accordance with certain example embodiments. Specifically, the trimmable section 372 of the second portion 310 is trimmed (shortened) along a break line 425 that separates the trimmable section 372 of the second portion 310 into a retained portion 411 and a discarded portion 412. In other words, the trimmable section 372 of the second portion 310 is divided along break line 425 between a discarded portion 412 and a retained portion 411, where the four remaining light sources 315 of the retained portion 411 remain electrically connected to the non-trimmable section 371, and where the three light sources 315 of the discarded portion 412 are not electrically connected to any other part of the circuit of FIG. 4.

When the discarded portion 412 is separated (trimmed) from the retained portion 411, the current that flows through each of the four light sources 315 of the retained portion 411 of the trimmable section 372 is slightly greater (approximately I/4, compared to I/7 when the discarded portion 412 remains part of the trimmable section 372 of the second portion 310). While this could lead to a higher than desired light output of each of the light sources 315 of the retained portion 411 of the second portion 310 relative to the light output of each of the light sources 315 of the non-trimmable section 371 of the second portion 310 of the trimmable section 372 and the light output of each of the light sources 315 of the non-trimmable section 371, the overall diffusion and brightness put out by all light sources 315 of the remaining circuit of FIG. 4 can be substantially unchanged to the human eye because of the strategic placement and/or different characteristics (e.g., brightness) of the light sources 315 of the non-trimmable section 371 of the second portion 310 and the light sources 315 of the non-trimmable section 371 relative to the placement and/or characteristics of the light sources of the retained portion 411 of the trimmable section 372 of the second portion 310.

Figure 5:
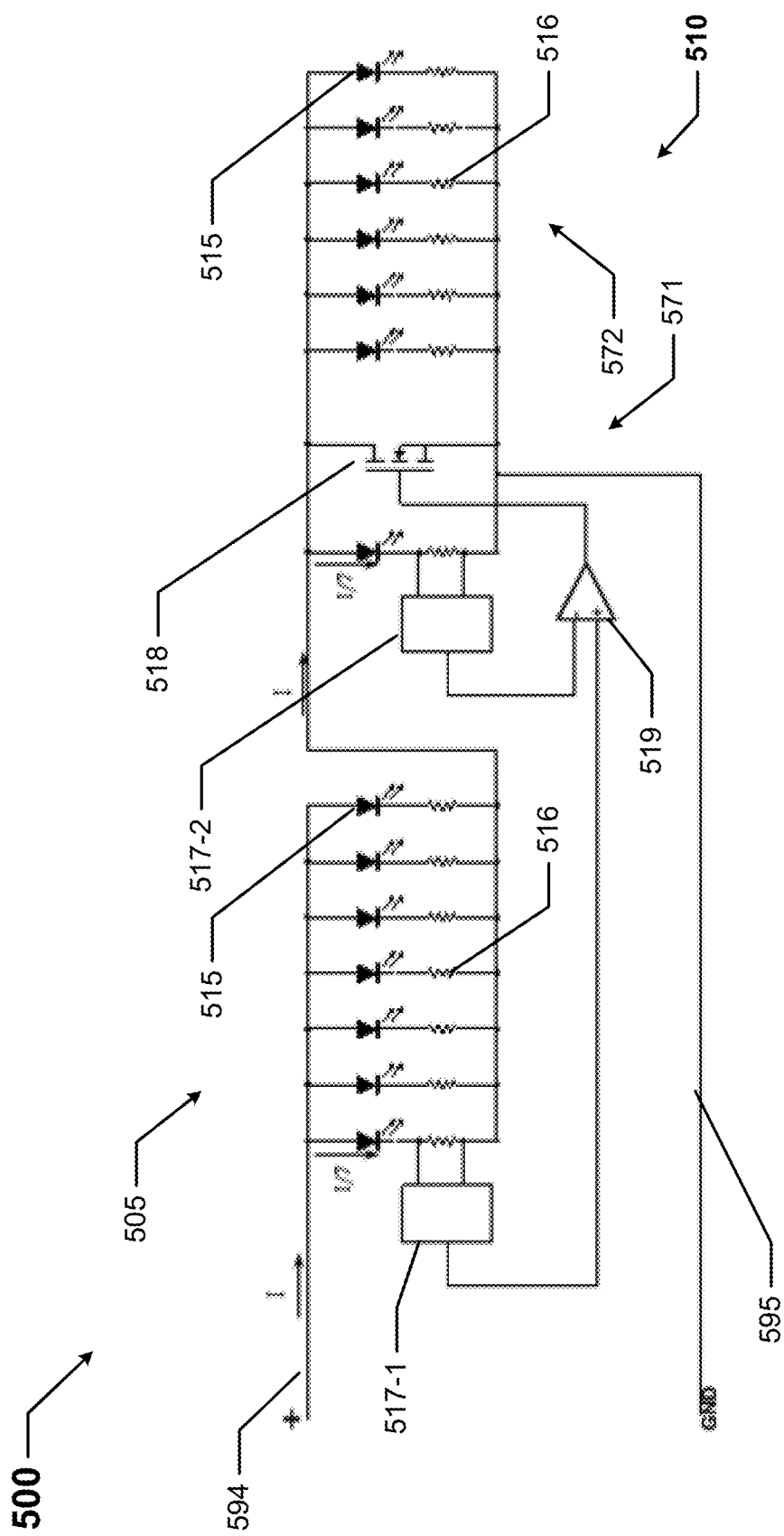
FIG. 5 shows another circuit diagram of an entire circuit in accordance with certain example embodiments.

FIG. 5 shows another circuit diagram 500 of an entire circuit in accordance with certain example embodiments. The circuit shown in the circuit diagram 500 of FIG. 5 can be disposed on a single adjustable length circuit board. Referring to FIGS. 1 through 5, the circuit of FIG. 5 has multiple portions. For example, in this case, the circuit shown in the circuit diagram 500 of FIG. 5 has a first portion 505 and a second portion 510. The first portion 505 is a fixed (non-trimmable) part of the circuit board and includes a known number (in this case, seven) of light sources 515 (e.g., LEDs) placed in parallel with each other, where each of those light sources 515 is placed in series with a resistor 516.

The electrical size of one of the light sources 515 and corresponding resistors 516 of the first portion 505 can be substantially the same as the electrical size of the other light sources 515 and corresponding resistors 516 of the first portion 505, so that each light source 515/resistor 516 pair of the first portion 505 draws substantially the same current (in this case, 1/7 of the total current feeding the first portion 505 from voltage leg 594 and eventually flowing to ground 595).

The first portion 505 of the circuit shown in the circuit diagram 500 of FIG. 5 also includes a current sensor 517-1, which measures the current flowing through the resistor 516 of one of the light source 515/resistor 516 pairs of the first portion 505. This measured current is sent by the current sensor 517-1 to a comparator 519, which is part of the non-trimmable section 571 of the second portion 510 of the circuit of FIG. 5.

The second portion 510 of the circuit of FIG. 5 has a non-trimmable section 571 and a trimmable section 572. As discussed above, the comparator 519 is part of the non-trimmable section 571 of the second portion 510 of the circuit of FIG. 5. Also included in the non-trimmable section 571 of the second portion 510 of the circuit of FIG. 5 is one or more (in this case, one) light sources 515 in series with an equal number of corresponding resistors 516. In some cases, a single resistor 516 shown in FIG. 5 can be replaced with multiple resistors that are arranged in series and/or in parallel with each other, where the multiple resistors, as a group, are in series with the corresponding light source 515.

If there are multiple light sources 515 and corresponding resistors 516 in the non-trimmable section 571 of the second portion 510, then those light source 515/resistor 516 pairs are connected in parallel with each other. The type and/or number of light sources 515 and the type and/or number of corresponding resistors 516 of the non-trimmable section 571 of the second portion 510 can be substantially the same as the type and/or number of light sources 515 and the type and/or number of corresponding resistors 516, respectively, of the first portion 505 of the circuit.

The trimmable section 572 of the second portion 510 of the circuit of FIG. 5 includes one or more (in this case six) light sources 515 in series with an equal number of corresponding resistors 516. If there are multiple light sources 515 and corresponding resistors 516 in the trimmable section 572 of the second portion 510, then those light source 515/resistor 516 pairs are connected in parallel with each other. The type and/or number of light sources 515 and the type and/or number of corresponding resistors 516 of the trimmable section 572 of the second portion 510 can be substantially the same as the type and/or number of light sources 515 and the type and/or number of corresponding resistors 516, respectively, of the first portion 505 of the circuit. Also, the light source 515/resistor 516 pair(s) of the non-trimmable section 571 in this example are connected in parallel with the light source 515/resistor 516 pairs of the trimmable section 572.

The non-trimmable section 571 of the second portion 510 of the circuit of FIG. 5 also includes another current sensor 517-2, which measures the current flowing through a resistor 516 (in this case, the only resistor 516) of one of the light source 515/resistor 516 pairs of the non-trimmable section 571 of the second portion 510 of the circuit. This measured current is also sent by the current sensor 517-2 to the comparator 519. The comparator 519 determines a difference between the current flowing through a light source 515/resistor 516 pair of the first portion 505, as measured by current sensor 517-1, and the current flowing through a light source 515/resistor 516 pair of the second portion 510, as measured by current sensor 517-2.

If there are an equal number of light source 515/resistor 516 pairs in the second portion 510 relative to the number of light source 515/resistor 516 pairs in the first portion 505, and if the values of the light sources 515 and corresponding resistors 516 of the first portion 505 are substantially the same as the values of the light sources 515 and corresponding resistors 516 of the second portion 510, then the comparator 519 will see that there is substantially no difference between the measurement received from current sensor 517-1 and current sensor 517-2.

The non-trimmable section 571 of the second portion 510 also includes a transistor 518. The source and drain of the transistor 518 are connected in parallel with the light source 515/resistor 516 pairs of the non-trimmable section 571 and the light source 515/resistor 516 pairs of the trimmable section 572. The gate of the transistor 518 is connected to the output of the comparator 519. In this way, if the comparator 519 detects no difference in its inputs (the signal from current sensor 517-1 and the signal from current sensor 517-2), then the transistor 518 is inactive (not turned on) because the current flowing through each of the light source 515/resistor 516 pairs of the second portion 510 is substantially identical to the current flowing through each of the light source 515/resistor 516 pairs of the first portion 505.

As a result, when the transistor 518 is inactive, no current flows from the source to the drain of the transistor 518 under the configuration of FIG. 5. In this way, the transistor 518 can be considered a type of switch that prohibits or allows current to flow therethrough, depending on whether the current flowing through a light source 515/resistor 516 pair of the first portion 505 matches the current flowing through a light source 515/resistor 516 pair of the second portion 510.

Figure 6:
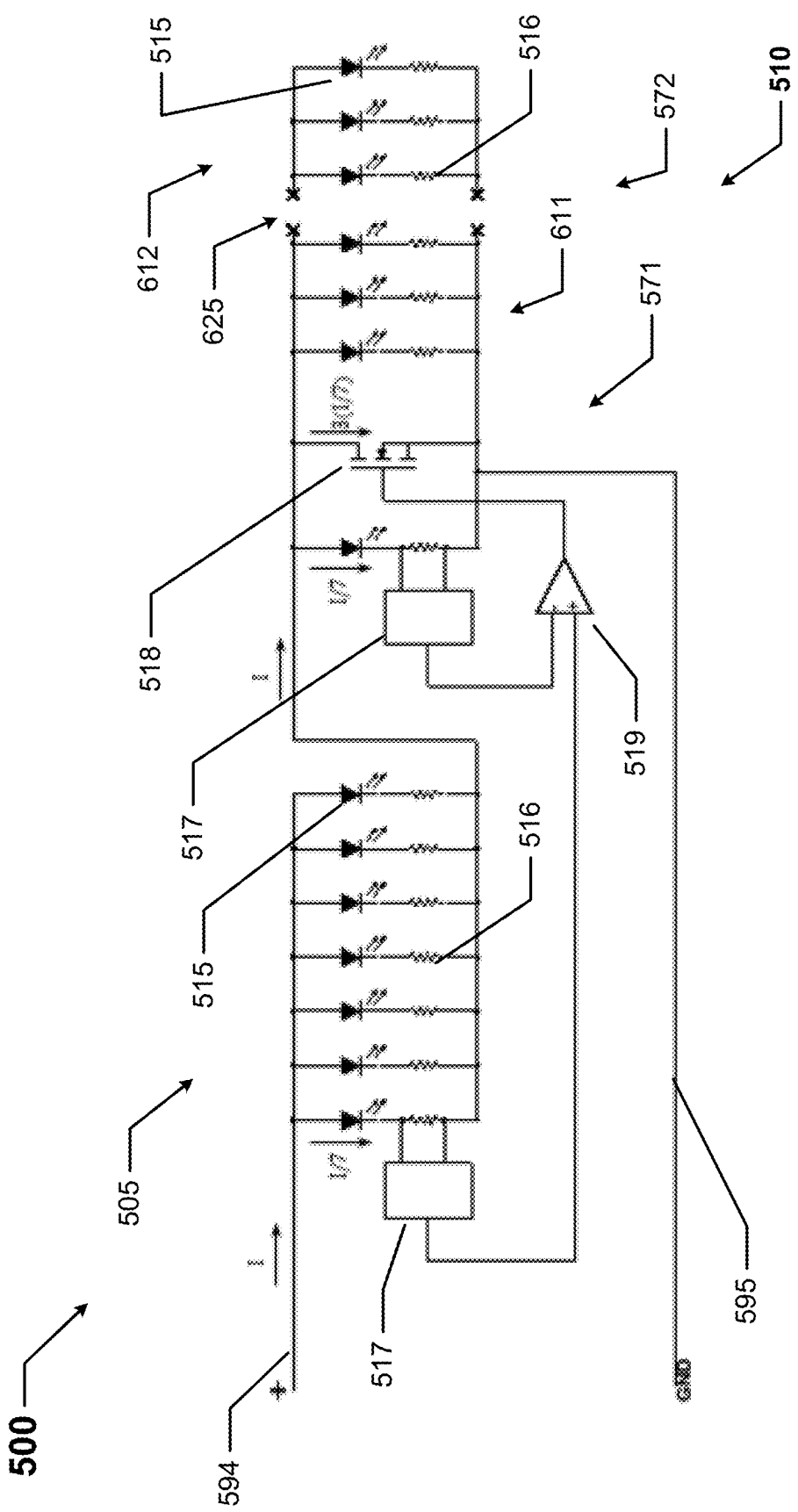
FIG. 6 shows the circuit diagram of FIG. 5 separated into two pieces in accordance with certain example embodiments.

FIG. 6 shows a circuit diagram 600 of a circuit that includes the circuit of FIG. 5 separated into two pieces in accordance with certain example embodiments. Specifically, the trimmable section 572 of the second portion 510 is trimmed (shortened) along a break line 625 from the six light source 515/resistor 516 pairs shown in FIG. 5 to three light source 515/resistor 516 pairs shown in FIG. 6. In other words, the trimmable section 572 of the second portion 510 is divided along break line 625 between a discarded portion 612 and a retained portion 611, where the retained portion 611 remains electrically connected to the non-trimmable section 571 of the second portion 510, and where the discarded portion 612 is not electrically connected to any other part of the circuit of FIG. 6.

When the discarded portion 612 of the second portion 510 is separated from the retained portion 611 of the second portion 510, without correction (e.g., with the transistor 518 remaining inactive), the current that flows through each of the light source 515/resistor 516 pairs of the non-trimmable section 571 and the retained portion 611 of the trimmable section 572 would be greater (approximately I/4) compared to the current (approximately I/7) when the discarded portion 612 remains part of the trimmable section 572). This can lead to a higher than desired light output of the light sources 515 of the second portion 510, as well as a higher level of stress on those light sources 515, leading to a shorter useful life, of those light sources 515, which is what occurs in the current art.

By contrast, the circuit shown in FIG. 6 eliminates these shortcomings of the current art. Specifically, in this case example, the comparator 519 receives a signal from the current sensor 517-1 that the current flowing through each of the light source 515/resistor 516 pairs of the non-trimmable section 571 is I/7, and the comparator 519 receives another signal from the current sensor 517-2 that the current flowing through each of the light source 515/resistor 516 pairs of the trimmable section 572 is I/4. This imbalance is output by the comparator 519 to the gate of the transistor 518. In response, the transistor 518 becomes activated and acts as a variable resistor (based on the magnitude of the signal received from the comparator 519) so that 3I/7 flows from the source to the drain of the transistor 518 under the configuration of FIG. 6.

As a result of the correction made by the transistor 518, the current that flows through each of the remaining four light source 515/resistor 516 pairs of the second portion 510 becomes I/7. Consequently, even though the second portion 510 is trimmed from seven light source 515/resistor 516 pairs to four light source 515/resistor 516 pairs, the comparator 519 and the transistor 518 act to self-correct the circuit so that the light output of all light sources 515 in the circuit of FIG. 6 is substantially the same as each other. The same principal applies regardless of how many of the light source 515/resistor 516 pairs is trimmed from the trimmable section 572 of the second portion 510.

In this example, the number of light source 515/resistor 516 pairs of the second portion 510 (when the second portion 510 has not been trimmed) is the same as the number of light source 515/resistor 516 pairs of the first portion 505. In alternative embodiments, the comparator 519 and/or the transistor 518 can be modified, or additions and/or other changes can be made to the circuit of FIG. 5, to perform the same passive control of current flowing through the light source 515/resistor 516 pairs of the second portion 510 when at least one of the light source 515/resistor 516 pairs of the second portion 510 have been trimmed.

Figure 7:
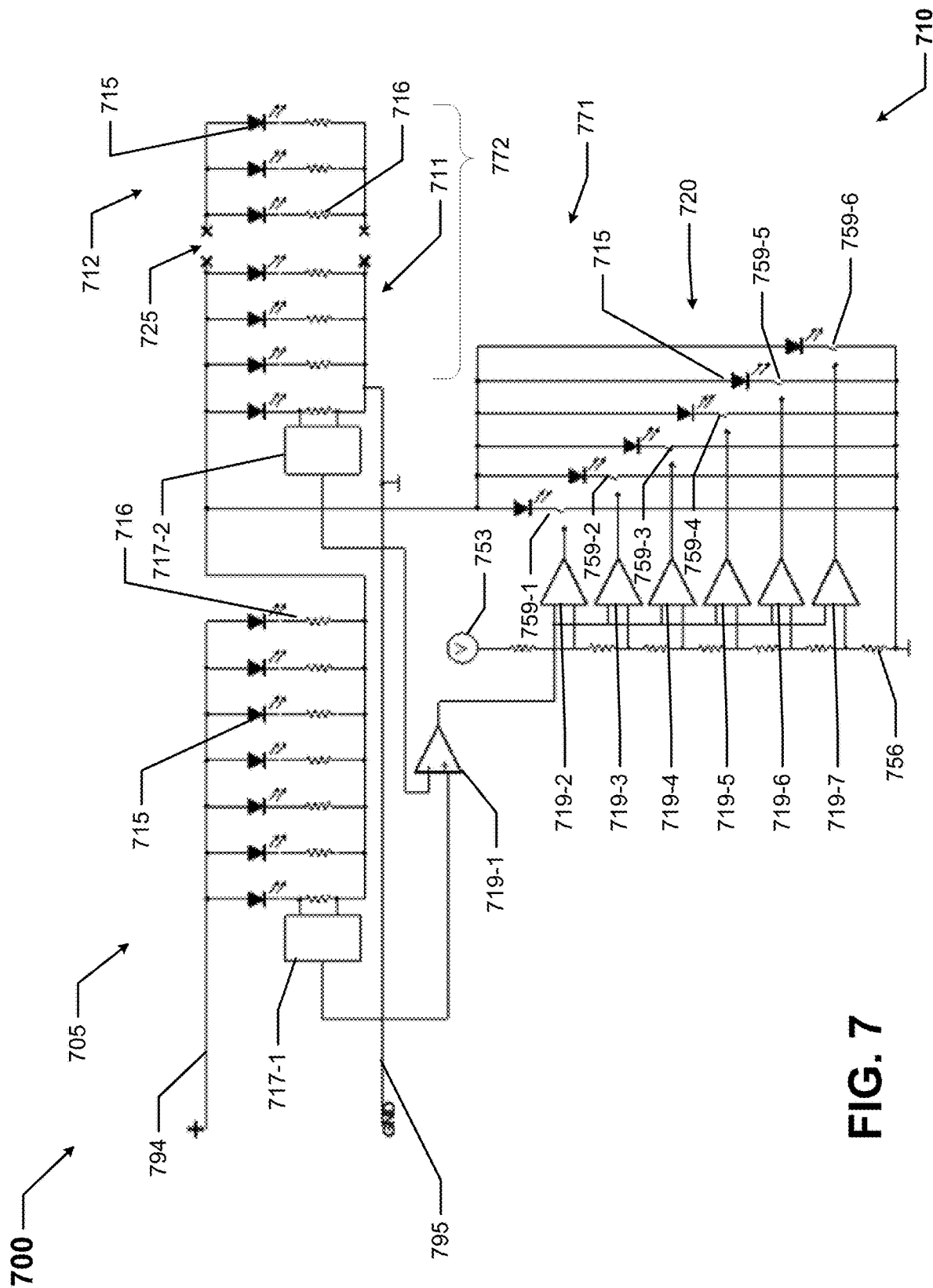
FIG. 7 shows yet another circuit diagram of a circuit in accordance with certain example embodiments.

FIG. 7 shows yet another circuit diagram 700 of a circuit in accordance with certain example embodiments. The circuit shown in the circuit diagram 700 of FIG. 7 can be disposed on a single adjustable length circuit board. Referring to FIGS. 1 through 7, the circuit of FIG. 7 has multiple portions. For example, in this case, the circuit shown in the circuit diagram 700 of FIG. 7 has a first portion 705 and a second portion 710. The first portion 705 is a fixed (non-trimmable) part of the circuit board and includes a known number (in this case, seven) of light sources 715 (e.g., LEDs) placed in parallel with each other, where each of those light sources 715 is placed in series with a corresponding resistor 716. The electrical size of each of the light sources 715 and corresponding resistors 716 can substantially the same as each other, so that each light source 715/resistor 716 pair draws substantially the same current (in this case, 1/7 of the total current feeding the first portion 705 from voltage leg 794 and eventually flowing to ground 795).

The first portion 705 of the circuit shown in the circuit diagram 700 of FIG. 7 also includes a current sensor 717-1, which measures the current flowing through the resistor 716 of one of the light source 715/resistor 716 pairs of the first portion 705. This measured current is sent by the current sensor 717-1 to a comparator 719-1, which is part of the non-trimmable section 771 of the second portion 710 of the circuit of FIG. 7.

The second portion 710 of the circuit of FIG. 7 has a non-trimmable section 771 and a trimmable section 772. As discussed above, the comparator 719-1 is part of the non-trimmable section 771 of the second portion 710 of the circuit of FIG. 7. Also included in the non-trimmable section 771 of the second portion 710 of the circuit of FIG. 7 is one or more (in this case, one) light sources 715 in series with an equal number of corresponding resistors 716. In some cases, a single resistor 716 shown in FIG. 7 can be replaced with multiple resistors that are arranged in series and/or in parallel with each other, where the multiple resistors, as a group, are in series with the corresponding light source 715.

If there are multiple light sources 715 and corresponding resistors 716 in the non-trimmable section 771 of the second portion 710, then those light source 715/resistor 716 pairs are connected in parallel with each other. The type and/or number of light sources 715 and the type and/or number of corresponding resistors 716 of the non-trimmable section 771 of the second portion 710 can be substantially the same as the type and/or number of light sources 715 and the type and/or number of corresponding resistors 716, respectively, of the first portion 705 of the circuit.

The trimmable section 772 of the second portion 710 of the circuit of FIG. 7 includes one or more (in this case six) light sources 715 in series with an equal number of corresponding resistors 716. If there are multiple light sources 715 and corresponding resistors 716 in the trimmable section 772 of the second portion 710, then those light source 715/resistor 716 pairs can be connected in parallel with each other. The type and/or number of light sources 715 and the type and/or number of corresponding resistors 716 of the trimmable section 772 of the second portion 710 can be substantially the same as the type and/or number of light sources 715 and the type and/or number of corresponding resistors 716, respectively, of the first portion 705 of the circuit. Also, the light source 715/resistor 716 pair(s) of the non-trimmable section 771 are connected in parallel with the light source 715/resistor 716 pairs of the trimmable section 772 in this example.

The non-trimmable section 771 of the second portion 710 of the circuit of FIG. 7 also includes another current sensor 717-2, which measures the current flowing through the resistor 716 of one of the light source 715/resistor 716 pairs of the non-trimmable section 771 of the second portion 710 of the circuit. This measured current is also sent by the current sensor 717-2 to the comparator 719-1. The comparator 719-1 determines a difference between the current flowing through the light source 715/resistor 716 pair of the first portion 705, as measured by current sensor 717-1, and the current flowing through the light source 715/resistor 716 pair of the second portion 710, as measured by current sensor 717-2. If there are an equal number of light source 715/resistor 716 pairs in the second portion 710 relative to the number of light source 715/resistor 716 pairs in the first portion 705 (or if the combination of values of the light source 715/resistor 716 pairs in the second portion 710 and the combination of values of the light source 715/resistor 716 pairs in the first portion 705 cause the current flowing through the current sensor 717-1 to be substantially equal to the current flowing through current sensor 717-2), then the comparator 719-1 will see that there is substantially no difference between the measurement received from current sensor 717-1 and current sensor 717-2.

The non-trimmable section 771 of the second portion 710 also includes a standby circuit 720. The standby circuit 720 is connected in parallel with the light source 715/resistor 716 pair(s) of the non-trimmable section 771 and the light source 715/resistor 716 pairs of the trimmable section 772. The standby circuit 720 includes a number (in this case, six) of light sources 715 that match the number of light sources 715 of the trimmable section 772 of the second portion 710. The light sources 715 of the standby circuit 720 are connected in parallel with respect to each other, and each light source 715 of the standby circuit 720 is connected in series with a switch 759 controlled by a dedicated comparator 719 (e.g., comparator 719-3).

Specifically, since there are six switches 759 (in this example, all normally-open switches) in the standby circuit 720 in this case, there are six corresponding comparators 719 (comparator 719-2, comparator 719-3, comparator 719-4, comparator 719-5, comparator 719-6, and comparator 719-7). Each switch 759 (switch 759-1, switch 759-2, switch 759-3, switch 759-4, switch 759-5, and switch 759-6) can be located on any part of the circuit board of the circuit, including but not limited to the first portion 705, the non-trimmable section 771 of the second portion 710, and the trimmable section 772 of the second portion 710.

The output of comparator 719-1 of the non-trimmable section 771 of the second portion 710 is connected in series with and provides an input to each of comparator 719-2, comparator 719-3, comparator 719-4, comparator 719-5, comparator 719-6, and comparator 719-7. In addition, a voltage source 753 is electrically connected to comparator 719-2, comparator 719-3, comparator 719-4, comparator 719-5, comparator 719-6, and comparator 719-7 as another input. In some cases, as shown in FIG. 7, a resistor 756 can be disposed in series with the voltage source 753 and in parallel with each pair of connections to adjacent comparators 719 of the standby circuit 720. The value of one resistor 756 can be the same or different than the value of one or more of the other resistors 756. The voltage source 753 provides some amount of power (e.g., in microamps) to the comparators 719 of the standby circuit 720. The voltage source 753 can be its own source of power. Alternatively, the voltage source 753 can be derived from the voltage leg 794.

In the embodiment shown in FIG. 7, if the comparator 719-1 detects no difference in its inputs (the signal from current sensor 717-1 and the signal from current sensor 717-2), then no signal is sent to the comparators 719 (in this case, comparator 719-2 through comparator 719-7) of the standby circuit 720, and all switches 759 (switch 759-1 through switch 759-6) of the standby circuit 720 remain open. As a result, none of the light sources 715 of the standby circuit 720 receive power to illuminate.

By contrast, if one or more of the light source 715/resistor 716 pairs of the trimmable section 772 of the second portion 710 of the circuit are removed, then at least part of the standby circuit 720 of the second portion 710 is engaged. For example, as shown in FIG. 7, three of the light source 715/resistor 716 pairs of the trimmable section 772 of the second portion 710 of the circuit are trimmed, as denoted by the break line 725 between a discarded portion 712 and a retained portion 711, where the retained portion 711 remains electrically connected to the non-trimmable section 771 of the second portion 710, and where the discarded portion 712 is not electrically connected to any other part of the circuit of FIG. 7. In such a case, the current sensor 717-2 would detect I/4 (as opposed to I/7 if the trimmable section 772 had not been trimmed).

When the comparator 719-1 receives this measurement from current sensor 717-2 and detects the discrepancy with the measurement (I/7) received from current sensor 717-1, the comparator 719-1 sends a signal to the standby circuit 720. In this example, comparator 719-2, comparator 719-3, and comparator 719-4 would engage their respective switches 759 (switch 759-1, switch 759-2, and switch 759-3, respectively), which results in the corresponding light sources 715 illuminating in the standby circuit 720. At the same time, comparator 719-5, comparator 719-6, and comparator 719-7 would remain idle, leaving their respective switches 759 (switch 759-4, switch 759-5, and switch 759-6, respectively) open, which in turn leaves the corresponding three light sources 715 in the standby circuit 720 off.

In this way, the standby circuit 720 serves as a one-for-one replacement of any light sources 715 of the trimmable section 772 that are trimmed. The various components of the standby circuit 720 can be strategically disposed along various portions of the circuit board (e.g., circuit board 231), including on the first portion 705, so that the light sources 715 of the standby circuit 720 that are illuminated help to provide a uniform illumination across the entire circuit board.

In some cases, when circuit boards are trimmed, too many light sources can be removed to cause the power supply (e.g., LED driver) to work improperly due to the remaining load falling below a minimum threshold (e.g., 21 V). In such a case, while the common configuration of light sources is to place groups of them in parallel with respect to each other, as shown in FIGS. 3 through 7 above, changing the configuration from parallel-connected to series-connected increases the load using the same number of light sources, thereby raising the load back above the minimum threshold required for proper operation of the power supply. Such a configuration can be useful, for example if the board is trimmed by over half its length.

Figure 8:
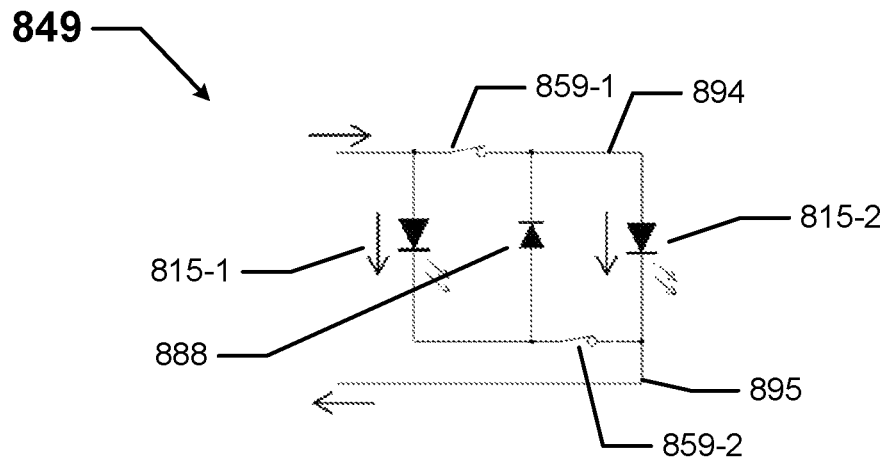
FIGS. 8 through 12 show various circuit configurations that increase load in accordance with certain example embodiments.
Figure 9:
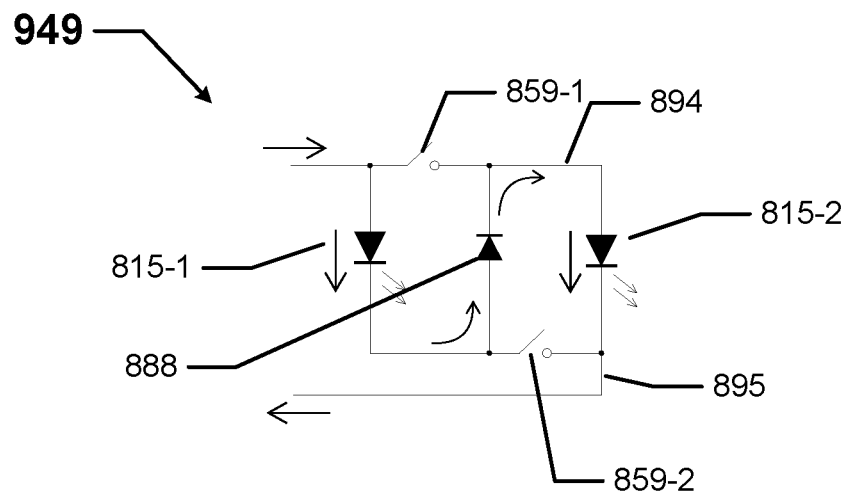
Figure 10:
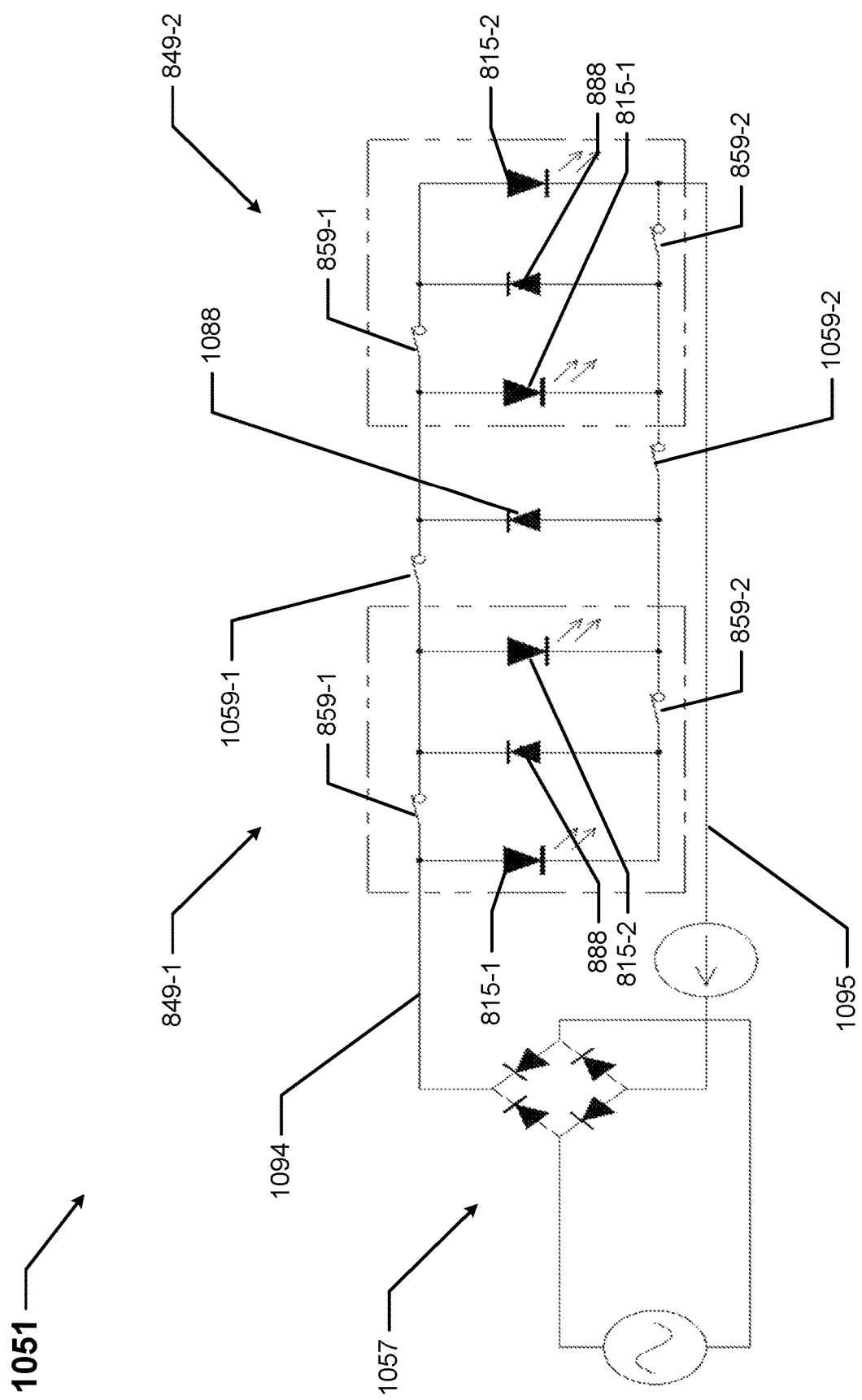
Figure 11:
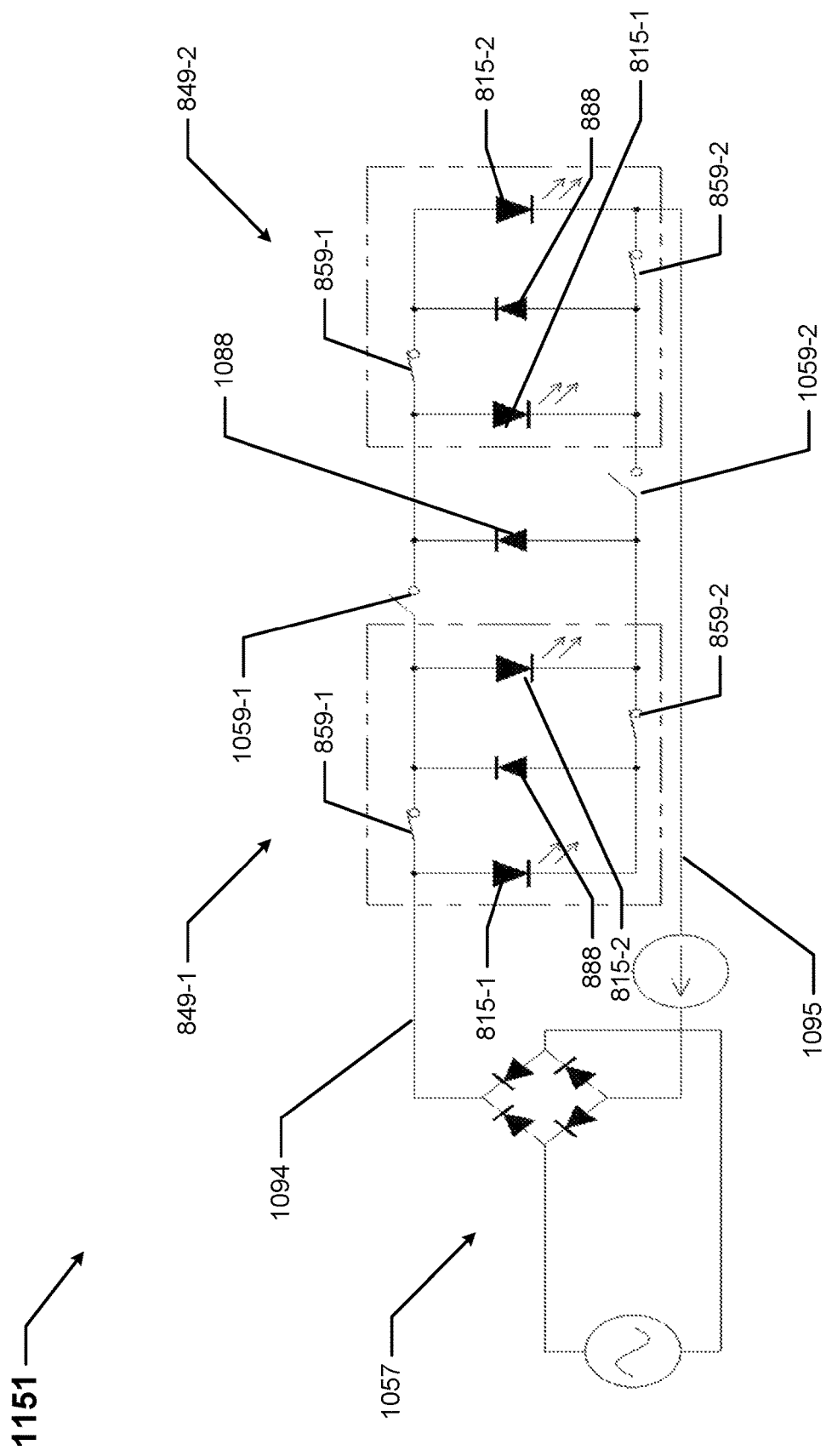
Figure 12:
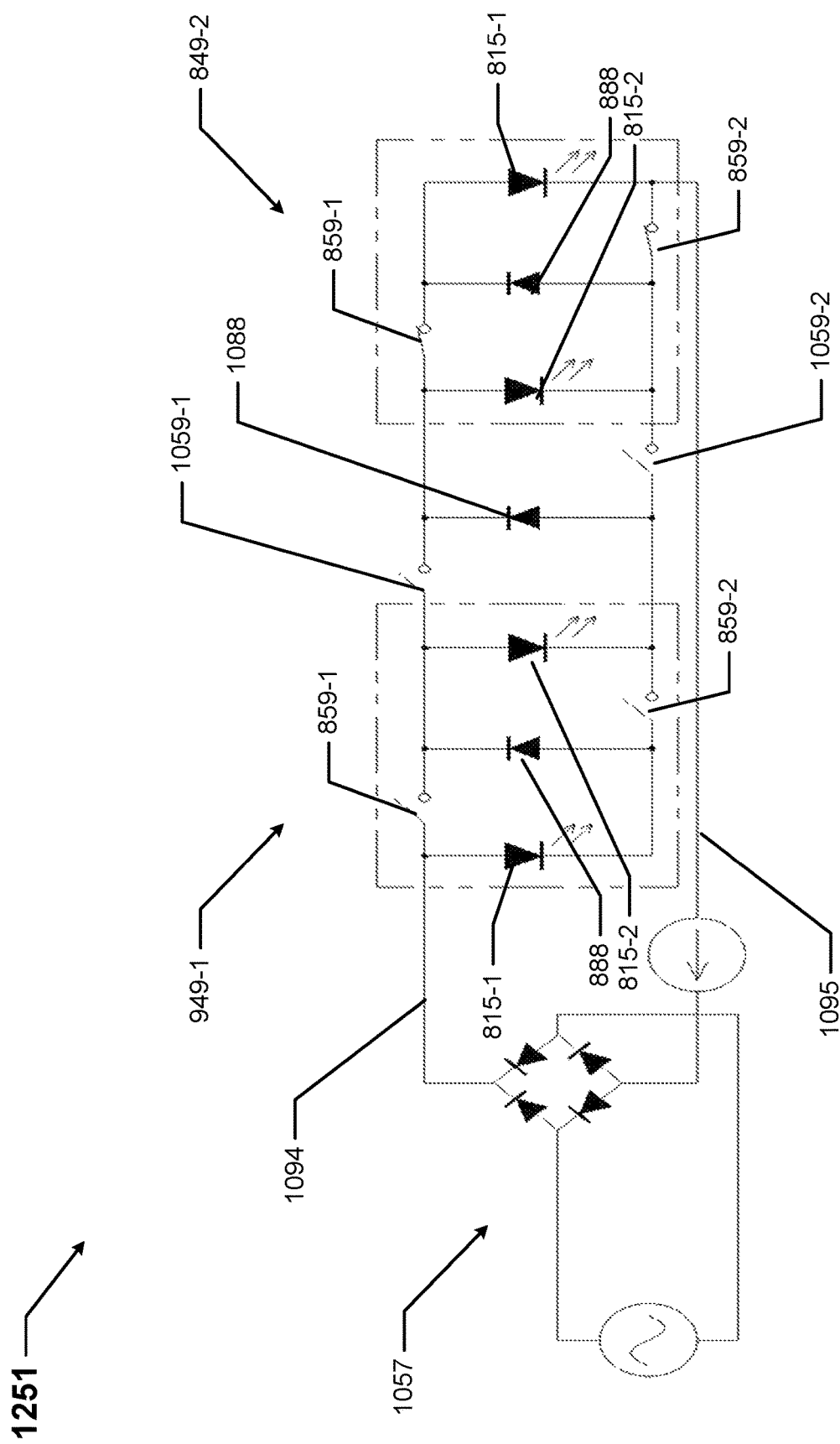

FIGS. 8 through 12 show various circuit configurations that increase load in accordance with certain example embodiments. Specifically, FIG. 8 shows a circuit diagram 849 with light sources 815 connected in parallel. FIG. 9 shows a circuit diagram 949 with the light sources 815 of FIG. 8 connected in series. FIG. 10 shows a circuit diagram 1051 with a number of light sources connected in parallel. FIG. 11 shows a circuit diagram 1151 with some of the light sources of FIG. 10 connected in series. FIG. 12 shows a circuit diagram 1251 with all of the light sources of FIG. 10 connected in series.

Referring to FIGS. 1 through 12, the circuit diagram 849 of FIG. 8 includes light source 815-1 and light source 815-2 connected in parallel with each other and also in parallel diode 888, which is oriented to only allow flow from bottom to top as shown in FIG. 8. In other words, the forward direction of the diode 888 is from bottom to top. The diode 888 is positioned between light source 815-1 and light source 815-2. The circuit diagram 849 also includes switch 859-1 positioned between the top of light source 815-1 and the diode 888 along electrical header 894 (e.g., a voltage line). The circuit diagram 849 further includes switch 859-2 positioned between the bottom of light source 815-2 and the diode 888 along electrical header 895 (e.g., ground). Each switch 859 can be located on any part of the circuit board of the circuit, including but not limited to the first portion, the non-trimmable section of the second portion, and the trimmable section of the second portion.

As shown in the configuration of FIG. 8, switch 859-1 and switch 859-2 are both closed, and so current flows from electrical header 894, through both light source 815-1 and light source 815-2 at the same time in parallel, ending at electrical header 895. Also, because the forward direction of the diode 888 is in the opposite direction of current flow in the circuit diagram 849 of FIG. 8, no current flows through the diode 888. The switches 859 can be operated automatically (e.g., based on firmware in an integrated circuit, using a hardware-based controller, based on a minimum voltage level that can reliably be provided by a power supply) or manually.

The circuit diagram 949 of FIG. 9 is configured identically to the circuit diagram 849 of FIG. 8, except that in this case switch 859-1 and switch 859-2 are both open, preventing current from flowing therethrough. As a result, current flows from part of electrical header 894 upstream from switch 859-1, through light source 815-1 to part of electrical header 895 upstream from switch 859-2, through diode 888 to the part of electrical header 894 downstream from switch 859-1, and then through light source 815-2 to the part of electrical header 895 downstream of switch 859-2. In other words, the configuration of FIG. 9 caused by opening the switches 859 puts light source 815-1 and light source 815-2 in series with each other.

The circuit diagram 1051 of FIG. 10 includes a power supply 1057 that provides power to two instances of the circuit diagram 849 of FIG. 8, as well as a diode 1088 and two switches 1059. Specifically, the power supply 1057 provides a positive voltage line 1094 and a ground 1095, where the positive voltage line 1094 is connected to the top side of circuit 849-1, the reverse bias of the diode 1088, and the top side of circuit 849-2, where the diode 1088 is placed between circuit 849-1 and circuit 849-2, and where circuit 849-1, the diode 1088, and circuit 849-2 are aligned in parallel with respect to each other. Also, switch 1059-1 is placed between circuit 849-1 and the reverse bias side of the diode 1088 on the positive voltage line 1094, and switch 1059-2 is placed between circuit 849-2 and the forward bias side of the diode 1088 on the ground 1095. Switch 1059-1 and switch 1059-2 are shown in the closed position in FIG. 10. Each switch 1059, circuit 849-1, diode 1088, and circuit 849-2 can be located on any part of the circuit board of the circuit, including but not limited to the first portion, the non-trimmable section of the second portion, and the trimmable section of the second portion.

As a result of this configuration of the circuit diagram 1051 of FIG. 10, and with all of the switches (switches 859-1 and 859-2 of circuit 849-1, switches 859-1 and 859-2 of circuit 849-2, switch 1059-1, and switch 1059-2) being in the closed position, all four light sources (light source 815-1 and light source 815-2 from circuit 849-1 and light source 815-1 and light source 815-2 from circuit 849-2) are connected in parallel with each other. In other words, the power supply 1057 provides power to all four light sources in circuit 1051 at the same time. The power supply 1057 can be a constant current driver or a constant power driver.

The circuit diagram 1151 of FIG. 11 is configured identically to the circuit diagram 1051 of FIG. 10, except that in this case switch 1059-1 and switch 1059-2 are both open, preventing current from flowing therethrough. As a result, current flows through light source 815-1 and light source 815-2 of circuit 849-1 in parallel with respect to each other, then through diode 888, and then through light source 815-1 and light source 815-2 of circuit 849-2 in parallel with respect to each other.

The circuit diagram 1251 of FIG. 12 is configured identically to the circuit diagram 1151 of FIG. 11, except that in this case circuit 849-1 of FIG. 11 is replaced with circuit 949-1, which is the same as circuit 949-1 of FIG. 9. In other words, circuit 949-1 differs from circuit 849-1 in that both switches 859-1 and 859-2 of circuit 949-1 are open, preventing current from flowing therethrough. As a result, current flows in series through light source 815-1 of circuit 949-1, then through diode 888, then through light source 815-2 of circuit 949-1, then through diode 1088, and then through light source 815-1 and light source 815-2 of circuit 849-2 in parallel with respect to each other.

If there is any capability of trimming light sources in circuits that utilize switches and diodes, as shown by way of example in FIGS. 8 through 12, trimming part of a circuit board can involve trimming multiple circuits (e.g., circuit 849) by the same amount. In other words, trimming circuit 1051 of FIG. 10 could include trimming one light source (e.g., light source 815-2) from circuit 849-1 and one light source (e.g., light source 815-2) from circuit 849-2.

Figure 13:
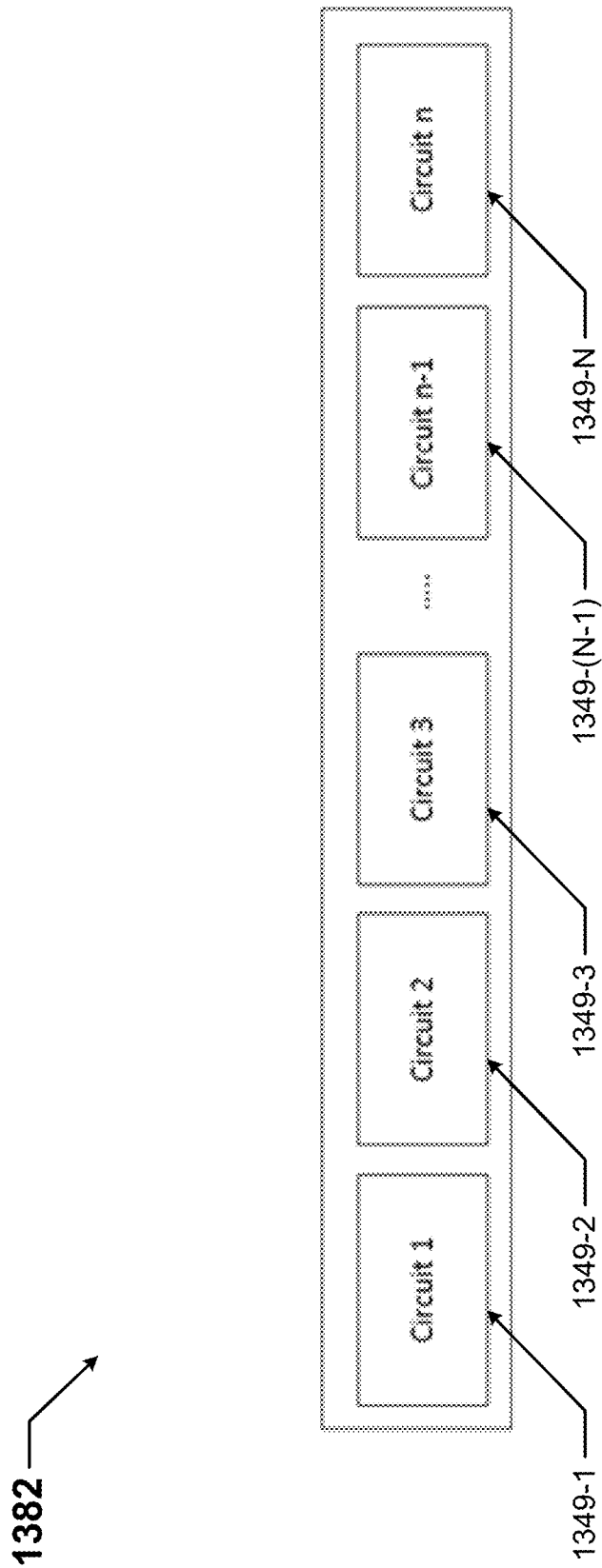
FIG. 13 shows a block diagram of a system in accordance with certain example embodiments.

FIG. 13 shows a block diagram of a system 1382 in accordance with certain example embodiments. In other words, FIG. 13 shows a general overview of how example embodiments can be configured to self-regulate for current on trimmed circuit boards. Referring to FIGS. 1 through 13, the system 1382 has N circuits 1394 (e.g., circuit 1394-1, circuit 1394-2, circuit 1394-3, circuit 1394-(N−1), circuit 1394-N). One circuit 1394 can be configured (e.g., in terms of components, in terms of the size (e.g., resistance values) of components, in terms of orientation of components) the same as, or differently than, one or more of the other circuits 1394 in the system 1382. Also, one circuit 1394 is electrically coupled (e.g., in series, in parallel) to at least one other circuit 1394 in the system 1382.

For example, a circuit 1394 in FIG. 13 can be substantially the same as the circuit 849 of FIG. 8 above. As another example, a circuit 1394 in FIG. 13 can be substantially the same as the second portion 510 of FIG. 5 above. As yet another example, a circuit 1394 in FIG. 13 can be substantially the same as the trimmable section 772 of the second portion 510 of FIG. 5 above. Some or all of a circuit 1394 in FIG. 13 can be trimmed.

Figure 14:
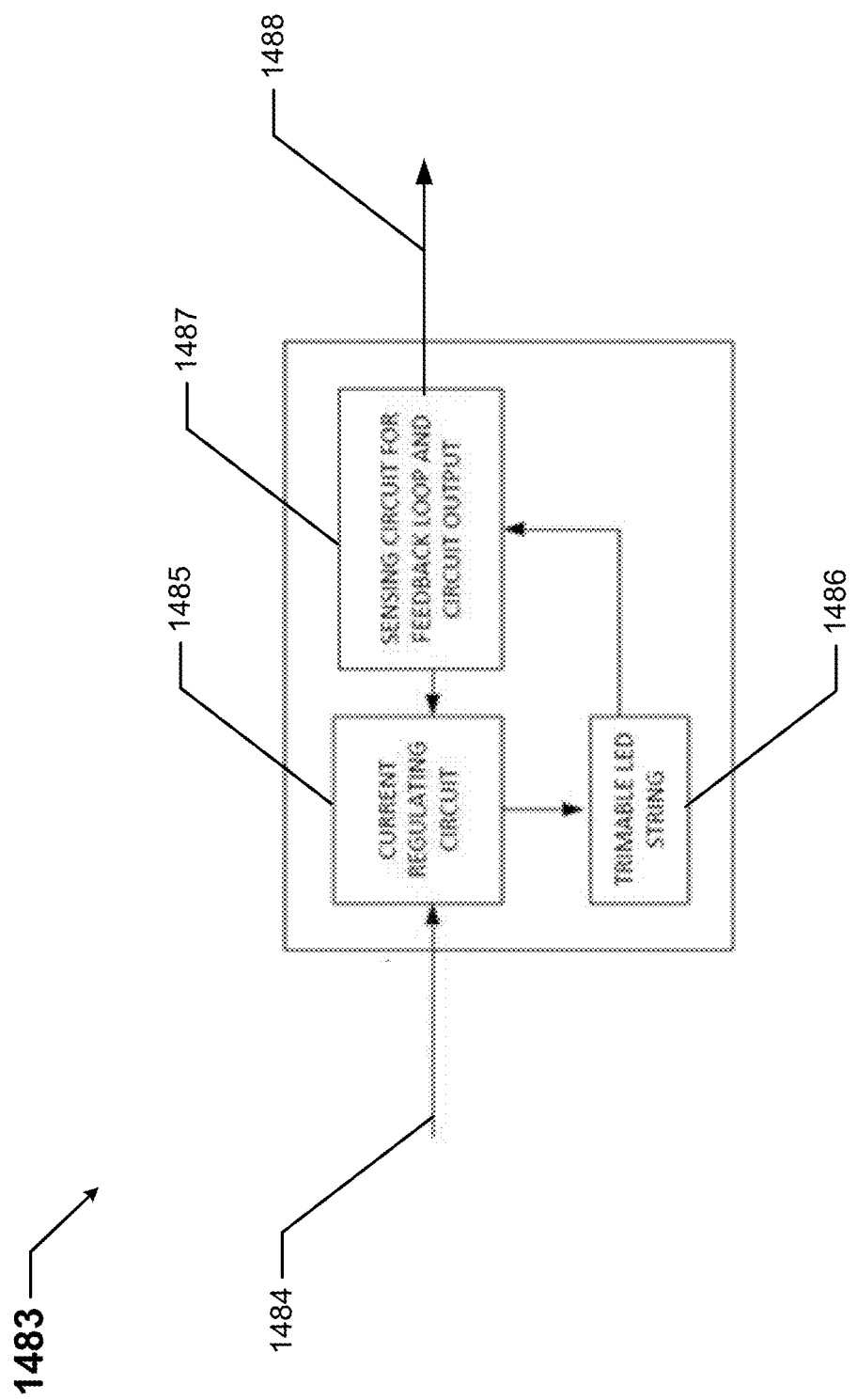
FIG. 14 shows a general process flow diagram followed using example embodiments.

FIG. 14 shows a general process flow diagram 1483 that is followed using example embodiments. Referring to FIGS. 1 through 14, and incorporating the example of FIGS. 5 and 6 above, the process flow diagram 1483 includes an input 1484 that delivers power to a current regulating circuit 1485 (e.g., first portion 505), which delivers power to a trimmable LED string 1486 (e.g., trimmable section 772), which uses a sensing circuit (e.g., current sensors 517) for a feedback loop (e.g., comparator 519 and switch 518) for output 1488 and feedback to the current regulating circuit 1485 (all of which are collectively block 1487).

Example embodiments can allow for self-regulating of light loads on circuit boards that are trimmable. In this way, when a circuit board is trimmed, the resulting light load can efficiently result in light that is emitted with uniform brightness, and with light sources that have a longer useful life. The cost of implementing example embodiments described herein can be extremely low. Also, the use of switches, diodes, and/or other similar devices can reconfigure the load on a trimmed circuit board to prolong the useful life of the power supply, as well as the reliability and performance of a light fixture, by preventing the load served by the power supply from falling below a minimum threshold value. Example embodiments also improve thermal management of a circuit board and/or lighting system.

Accordingly, many modifications and other embodiments set forth herein will come to mind to one skilled in the art to which example embodiments pertain having the benefit of the teachings presented in the foregoing descriptions and the associated drawings. Therefore, it is to be understood that example embodiments are not to be limited to the specific embodiments disclosed and that modifications and other embodiments are intended to be included within the scope of this application. Although specific terms are employed herein, they are used in a generic and descriptive sense only and not for purposes of limitation.

What is claimed is:

1. An electrical circuit comprising:
 a circuit board comprising a first portion and a second portion, wherein the second portion comprises a trimmable section and a non-trimmable section, wherein the circuit board is a first single continuous piece without interruption with respect to the first portion and the second portion when the second portion includes the trimmable section;
 at least one first light source disposed on the first portion;
 a power supply disposed on the first portion;
 a plurality of second light sources disposed on the trimmable section of the second portion;
 at least one third light source disposed on the non-trimmable section of the second portion;
 a first current sensor that measures a first current flowing through the first light source;
 a second current sensor that measures a second current flowing through the second light source; and
 a first comparator that compares the first current and the second current,
 wherein the trimmable section is trimmed to form a trimmed second portion and a trimmed circuit board, wherein the trimmed circuit board is a second single continuous piece without interruption with respect to the first portion and the trimmed second portion,
 wherein the trimmed circuit board has disposed thereon a remainder of the plurality of the second light sources,
 wherein the power supply, the at least one first light source, the remainder of the plurality of second light sources, the first current sensor, the second current sensor, the first comparator, and the at least one third light source are disposed on the trimmed circuit board in such a way as to provide substantially uniform light when the power supply provides power to the at least one first light source, the remainder of the plurality of second light sources, and the at least one third light source.

2. The electrical circuit of claim 1, wherein the first portion and the non-trimmable section of the second portion have a same number of light sources.

3. The electrical circuit of claim 2, wherein the plurality of second light sources comprises the same number of light sources.

4. The electrical circuit of claim 2, wherein the trimmable section is configured to be trimmed in multiple locations, wherein each of the multiple locations, when trimmed, yields a different number of the remainder of the plurality of second light sources relative to others of the multiple locations.

5. The electrical circuit of claim 1, further comprising:
 a switch electrically connected to the remainder of the plurality of second light sources disposed on the trimmed circuit board.

6. The electrical circuit of claim 5, further comprising:
 at least one first resistor connected in series with the at least one first light source.

7. The electrical circuit of claim 6, further comprising:
 at least one second resistor connected in series with the plurality of second light sources.

8. The electrical circuit of claim 7,
wherein the first comparator operates the switch when a difference between the first current and the second current exceeds a threshold value.

9. The electrical circuit of claim 8, wherein the switch comprises a MOSFET transistor connected in parallel with the remainder of the plurality of second light sources.

10. The electrical circuit of claim 8, wherein the switch comprises at least one of a plurality of switches connected to at least one of a plurality of standby light sources of a standby circuit.

11. The electrical circuit of claim 10, wherein the plurality of standby light sources of the standby circuit has a first number of light sources that equal the first number of the plurality of second light sources.

12. The electrical circuit of claim 11, wherein each of the plurality of standby light sources of the standby circuit corresponds to each of the plurality of second light sources.

13. The electrical circuit of claim 12, wherein a trimmed second light source of the plurality of second light sources that is excluded from the remainder disables a corresponding standby light source of the plurality of standby light sources of the standby circuit.

14. The electrical circuit of claim 1, further comprising:
at least one switch connected to the remainder of the plurality of second light sources of the trimmable section, wherein operating the at least one switch reconfigures at least two of the remainder of the plurality of second light sources from parallel-connected to series-connected.

15. The electrical circuit of claim 14, further comprising:
at least one diode electrically coupled to the remainder of the plurality of second light sources of the trimmable section, wherein the at least one diode further reconfigures the at least two of the remainder of the plurality of second light sources from parallel-connected to series-connected.

16. A linear light fixture comprising:
an insert comprising a base wall having a first length; and
a lighting assembly removably disposed on the base wall of the insert, wherein the lighting assembly comprises:
a circuit board comprising a first portion and a second portion, wherein the second portion comprises a trimmable section and a non-trimmable section;
at least one first light source disposed on the first portion;
a plurality of second light sources disposed on the trimmable section of the second portion;
at least one third light source disposed on the non-trimmable section of the second portion;
a switch disposed on the non-trimmable section of the second portion;
at least one first resistor connected in series with the at least one first light source;
a first current sensor that measures a first current flowing through the at least one first resistor;
at least one second resistor connected in series with the plurality of second light sources;
a second current sensor that measures a second current flowing through the at least one second resistor; and
a first comparator that compares the first current measured by the first current sensor and the second current measured by the second current sensor, wherein the first comparator operates the switch when a difference between the first current and the second current exceeds a threshold value,
wherein the trimmable section is trimmed to form a trimmed circuit board having a second length that is no greater than the first length,
wherein the trimmed circuit board has disposed thereon a remainder of the plurality of second light sources,
wherein the switch is connected in parallel with the remainder of the plurality of second light sources,
wherein the at least one first light source, the remainder of the plurality of second light sources, and the at least one third light source are disposed on the trimmed circuit board in such a way as to provide substantially uniform light.

17. An electrical circuit comprising:
a circuit board comprising a first portion and a second portion, wherein the second portion comprises a trimmable section;
at least one first light source disposed on the first portion;
a plurality of second light sources disposed on the trimmable section of the second portion;
a first switch; and
a second switch,
wherein at least a portion of the trimmable section is trimmed away to generate a trimmed second portion,
wherein a subset of the plurality of second light sources are disposed on the trimmed second portion,
wherein the first switch and the second switch are connected to the subset of the plurality of second light sources, wherein operating the first switch and the second switch reconfigures at least two of the subset of the plurality of second light sources from parallel-connected to series-connected,
wherein the at least one first light source and the subset of the plurality of second light sources are arranged on the first portion and the trimmed second portion of the circuit board in such a way as to provide substantially uniform light.

18. The electrical circuit of claim 17, wherein the second portion of the circuit board further comprises a non-trimmable section that has disposed thereon at least one third light source, wherein the at least one first light source, the subset of the plurality of second light sources, and the at least one third light source are arranged on the first portion, the trimmed second portion, and the non-trimmable section of the circuit board in such a way as to provide the substantially uniform light.

* * * * *